United States Patent [19]

Nester

[11] 4,328,298

[45] May 4, 1982

[54] PROCESS FOR MANUFACTURING LITHOGRAPHY MASKS

[75] Inventor: James F. Nester, Ridgefield, Conn.

[73] Assignee: The Perkin-Elmer Corporation, Norwalk, Conn.

[21] Appl. No.: 52,514

[22] Filed: Jun. 27, 1979

[51] Int. Cl.³ .............................................. C23F 1/00
[52] U.S. Cl. ...................................... 430/5; 156/634; 156/636; 156/659.1; 427/259; 427/264; 427/265; 427/266; 427/282; 427/287; 427/304; 427/305; 430/324; 430/325
[58] Field of Search .............. 427/282, 259, 287, 304, 427/305, 264, 265, 266; 156/656, 634, 659.1; 430/313, 315, 318, 5, 325, 324

[56] References Cited

U.S. PATENT DOCUMENTS

| | | | |
|---|---|---|---|
| 2,702,253 | 2/1955 | Bergstrom | 427/304 |
| 2,924,534 | 2/1960 | Morse | 427/259 |
| 3,367,792 | 2/1968 | Levine | 427/304 |
| 3,558,290 | 1/1971 | Baier et al. | 427/306 |
| 3,957,552 | 5/1976 | Ahn et al. | 427/259 |
| 4,001,061 | 1/1977 | Ahn et al. | 427/259 |

*Primary Examiner*—Norman Morgenstern
*Assistant Examiner*—Janyce A. Bell
*Attorney, Agent, or Firm*—Salvatore A. Giarratana; Edwin T. Grimes; Thomas P. Murphy

[57] ABSTRACT

A method for manufacturing X-ray lithography masks containing features smaller than 1 micron in size and having conductive or non-conductive substrates. The method involves the initial deposition, as by evaporation, of a very thin coating of a strong X-ray absorber such as gold. A layer of photoresist is applied to the initial gold layer and exposed and developed to remove the photoresist in the exposed areas. Thereafter, the mask is submerged in an electroless gold plating bath. I have discovered that metals suitable for electroless plating are autocatalytic in nature. Accordingly, additional gold from the bath is preferentially deposited on the exposed first gold layer and is permitted to build to the desired thickness.

9 Claims, 4 Drawing Figures

PROCESS FOR MANUFACTURING LITHOGRAPHY MASKS

BACKGROUND OF THE INVENTION

This invention relates to masks used in lithography and, more particularly, to a method of making a mask which can be used for X-ray lithography.

In the manufacture of integrated semiconductor circuits, various types of lithography are used in order to expose a photoresist which is deposited on the semiconductor wafer. With requirements for miniaturization and placing more devices on a given chip, lithography has progressed towards shorter wavelengths. Shorter wavelengths are necessary in order to obtain good resolution and small size. Thus, there has been a progression from optical lithography utilizing the visible spectrum to ultraviolet lithography and, more recently, to X-ray lithography. X-rays have a particularly short wavelength and permit particularly fine features to be defined. In such lithography, a mask having the desired pattern thereon is interposed between the source of radiation, for example, UV or X-ray, and a semiconductor substrate coated with the resist on which the pattern is to be exposed. The mask must result in good definition of the lines being exposed, with the masked area being opaque to the radiation being used and the mask substrate being transparent to that radiation. Because of the small line widths which it is desired to achieve in X-ray lithography, the making of a mask which will provide good resolution becomes a problem.

The typical material used as an absorber on masks used in X-ray lithography is gold. Although other elements exhibit an increase in soft X-ray absorption, gold is notably easier to work with. Two methods that have been employed in the prior art are electroplating and evaporation/liftoff. Since certain of the mask substrates desired to be used in X-ray lithography are non-conductive, electroplating would be quite difficult. The evaporation/liftoff technique is described in co-pending application Ser. No. 107,744 now abandoned, filed 12-26-79, of D. W. Buckley and assigned to the same assignee as the present invention. It is a useful technique but has been found to be inapplicable for the manufacture of masks containing features smaller than one micron in size.

In a paper entitled "Electroless Gold Metallization for Polyvinylidene Fluoride Films", 125 *Journal Electrochemical Society* 522, April 1978, by L. M. Schiavone, there is described a technique for plating plastic film. As pointed out in that article, several important steps must be followed—namely, cleaning, sensitizing, activating, plating, and post cleaning. The author points out that cleaning is probably the most important step. After cleaning, the film is sensitized by immersing it in a bath of photosensitive salts. The film is then exposed. Thereafter, the film is immersed in a solution of a catalyst which will react with the activator chemicals. As pointed out by the author, palladium is an excellent catalyst for gold and he discloses a palladium chloride, acetic acid bath. After rinsing, the prepared film is immersed in a cyanide based gold plating bath where gold plates preferentially on the palladium catalyst. It has been observed that the gold deposited by this complex process adheres poorly to the substrate, an effect believed to be related to the thoroughness of the initial substrate cleaning.

Accordingly, it is an object of the present invention to provide a method for manufacturing a mask for X-ray lithography employing a substrate which may be non-conductive and forming thereon an X-ray absorbing gold pattern, the gold having an improved adherence to the substrate and being capable of defining features having dimensions of less than 1 micron. The manner in which this and other objects are achieved will be apparent from the following description and appended claims.

SUMMARY OF THE INVENTION

A method of making a lithography mask which comprises providing a substrate which is transparent to the radiation to be used in the lithography process and depositing on the substrate a thin first layer of a metal suitable for electroless plating. The thin first layer of metal is then covered with a layer of photoresist and the photoresist is exposed through a master mask to expose areas at which lithographic radiation absorption is desired. The photoresist is then developed to uncover the thin first metal layer in the exposed areas. Thereafter, the substrate is immersed in an electroless metal plating bath whereby a relatively thick second layer of the metal is preferentially precipitated onto the uncovered areas of the first metal layer. The plated substrate is then removed from the bath and cleaned of the photoresist.

DESCRIPTION OF THE PREFERRED EMBODIMENTS

This invention is based upon the realization that in the gold deposition process described in the Schiavone paper, supra, the substrate bound catalyst chemical (palladium) is quickly covered by the deposited gold and thus serves only to initiate the gold deposition reaction. Subsequent gold deposition must, therefore, occur by an autocatalytic action of the previously deposited gold. Accordingly, the present invention comprises a simplification of the Schiavone procedure by eliminating the need for stringent cleaning, photoactivators, and catalyst chemicals. Although the invention as described herein is primarily directed to gold plating, I have discovered that the underlying autocatalytic effect is also present in other metals capable of electroless plating. These include, for example, copper, nickel, arsenic, chromium, cobalt, iron, and palladium.

In accordance with one method for practicing the present invention, gold as a thin first layer of approximately 200 Å is vacuum evaporated onto the insulating substrate. Portions of this thin first layer may then be masked, as by a photoresist, and the method is continued by proceeding directly to immersion in an electroless gold plating solution. In structures such as X-ray lithography masks, gold may be deposited to a thickness in excess of 5,000 Å. If it is thereafter desired to have areas of the substrate gold free, the 200 Å gold precoating may be removed with a suitable etchant. This will, of course, cause the loss of 200 Å of gold from the deposit areas, but that small percentage of gold removal is unimportant.

Figure 1:
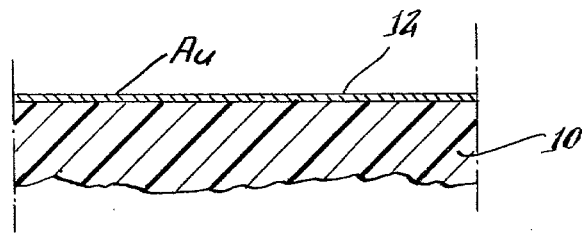
FIG. 1 is a cross section, greatly enlarged, illustrating an initial step in manufacturing a mask by the method of the invention.
Figure 2:
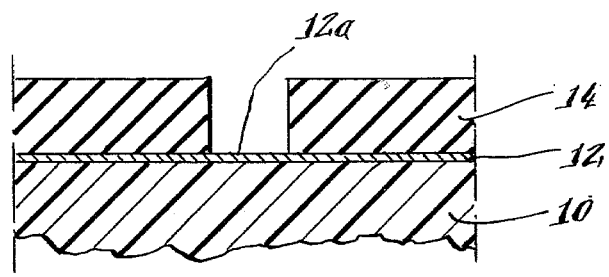
FIG. 2 is a view similar to FIG. 1 illustrating a further step in the method of the invention.

With particular reference to FIG. 1, there is illustrated a portion of a film 10 which is transparent to X-rays and is otherwise suitable for use as an X-ray lithographic mask substrate. It may be, for example, a thermoplastic polyester (polyethylene teraphthalate) or a thermoset polyimide sold, respectively, under the trademarks MYLAR and KAPTON. Applied to the surface of the film 10 is a very thin layer 12 of gold applied by vacuum evaporation. This gold layer may be on the order of 200 Å thick. In order to improve the adhesion of gold to film, the gold layer may be preceded by a "flash" layer of chromium to a thickness of approximately 50 Å. There is then applied to the gold layer 12, a layer 14 of photoresist which is exposed and developed. (The photoresist layer 14 is desirably thicker than the final gold thickness.) The exposed areas are thereby removed in response to the exposure pattern, resulting in the uncovering of certain areas of gold layer 12, such as 12a in FIG. 2. Thereafter, the mask substrate is immersed in an electroless plating solution, such as a solution consisting of:

KAu(CN)$_2$
H$_2$O
NH$_4$OH

Figure 3:
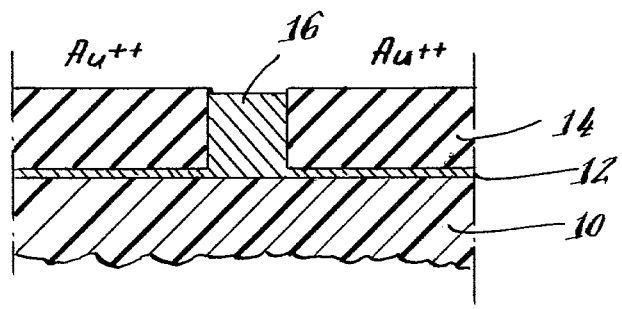
FIG. 3 is a view similar to FIGS. 1 and 2 illustrating a further step in the method of the invention; and, FIG. 4 is a view similar to FIGS. 1-3 illustrating a portion of the completed mask.

Ingredients for such a solution are obtainable from the Sel-Rex Division of Oxy Metal Industries Corporation, Nutley, New Jersey. The free gold ions in solution, as shown in FIG. 3, precipitate preferentially upon the region 12a of gold layer 12 as a result of the newly recognized autocatalytic action of gold. The rate of precipitation depends upon the solution temperature. At a temperature, for example, of 55° C., the precipitated layer 16, as shown in FIG. 3, will achieve a thickness of 5,000 Å in approximately one hour. It is desirable that layer 16 not exceed the thickness of photoresist layer 14 to prevent "mushrooming" over the latter.

Figure 4:
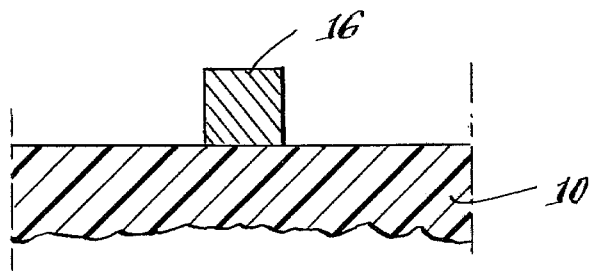

The photoresist layer may be removed by any suitable method such as, for example, by dissolving it in acetone. If it is desirable for the substrate to have gold-free areas after plating, it may be etched in a suitable etchant, such as an iodine solution. Removing the 200 Å of gold will also have the result of removing 200 Å from the precipitated gold layer 16. As a practical matter, this is an unimportant dimensional change. The result, as illustrated in FIG. 4, is a substrate film 10 having thereon a well adhered pattern of precipitated gold 16. The adherence of such an electrolessly deposited gold has been found to be equal to that of the evaporated gold precoating layer.

It is believed that the many advantages of this invention will now be apparent to those skilled in the art. It will also be apparent that many variations and modifications may be made therein without departing from the spirit and scope of the invention. For example the method is not limited to the making of lithographc masks. Similarly, other metals than gold, such as set forth above, may be employed. Accordingly, the foregoing disclosure is to be construed as illustrative only, rather than limiting. This invention is limited only by the scope of the following claims.

What is claimed is:

1. A method of making a lithography mask which comprises:
    (a) providing a substrate which is transparent to the radiation to be used in the lithography process;
    (b) depositing on said substrate a flash layer of chromium;
    (c) depositing on said layer of chromium a thin first layer of a metal suitable for electroless plating;
    (d) covering said first metal layer with a layer of photoresist;
    (e) exposing the photoresist through a master mask to thereby expose areas at which lithographic radiation absorption is desired;
    (f) developing the photoresist to uncover the thin first metal layer in said areas;
    (g) immersing the substrate in an electroless metal plating bath whereby a relatively thick second layer of said metal is preferentially precipitated onto the uncovered areas of said first metal layer; and
    (g) removing the plated substrate from said bath;
    (h) removing the remaining portion of the layer of photoresist;
    (i) etching the plated substrate to remove a thickness of metal substantially equal to the thickness of said first metal layer.

2. The method of claim 1 wherein said metal is gold.
3. The method of claim 1 wherein said metal is copper.
4. The method of claim 1 wherein said metal is nickel.
5. The method of claim 1 wherein said metal is arsenic.
6. The method of claim 1 wherein said metal is chromium.
7. The method of claim 1 wherein said metal is cobalt.
8. The method of claim 1 wherein said metal is iron.
9. The method of claim 1 wherein said metal is palladium.

* * * * *

UNITED STATES PATENT AND TRADEMARK OFFICE
CERTIFICATE OF CORRECTION

PATENT NO. : 4,328,298
DATED : May 4, 1982
INVENTOR(S) : James F. Nester

It is certified that error appears in the above-identified patent and that said Letters Patent are hereby corrected as shown below:

Column 1, line 41, after Ser. No., change "107,744" to --107,749-- and delete "now abandoned", Column 2, line 44, change "supra" to --*supra*--, Column 4, line 35, change 2nd "(g)" to --(h)--, line 36, change "h" to --(i)--, line 38, change "(i)" to --(j)--.

Signed and Sealed this

Twenty-sixth Day of October 1982

[SEAL]

Attest:

Attesting Officer

GERALD J. MOSSINGHOFF

Commissioner of Patents and Trademarks